United States Patent [19]

Bloodworth et al.

[11] 4,339,715
[45] Jul. 13, 1982

[54] CARRIER-DOMAIN MAGNETOMETERS WITH COMPENSATION RESPONSIVE TO VARIATIONS IN OPERATING CONDITIONS

[75] Inventors: Greville G. Bloodworth, York; Martin H. Manley, London, both of England

[73] Assignee: The General Electric Company Limited, London, England

[21] Appl. No.: 142,971

[22] Filed: Apr. 23, 1980

[30] Foreign Application Priority Data

May 4, 1979 [GB] United Kingdom .................. 7915666

[51] Int. Cl.³ .................. G01R 33/02; H01L 29/82
[52] U.S. Cl. ................................ 324/252; 357/27; 307/309
[58] Field of Search .................. 324/251, 252; 357/27; 307/309

[56] References Cited

U.S. PATENT DOCUMENTS 3,219,909 11/1965 Foster .............................. 324/251
4,250,518 2/1981 Bloodworth et al. ............. 357/27

FOREIGN PATENT DOCUMENTS 2004117 4/1979 United Kingdom .

OTHER PUBLICATIONS

"Digital Outproduced by Magnetic Field Sensor", 4/1977, Electronics Design, vol. 125, p. 150.
Gilbert, "Novel Magnetic Field Sensor . . . ", 11/1976, Electronics Letters, vol. 12, No. 23, pp. 608–609.
Bloodworth et al. "Novel Magnetic Field Sensor . . . ", 11/1976, Electronics Letters, vol. 12, No. 23, pp. 609–611.
Bloodworth et al., "The Carrier Domain Magnetometer", 11/1978, Solid State and Electronic Devices, vol. 2, No. 6, pp. 176–184.

Primary Examiner—Gerard R. Strecker
Assistant Examiner—Walter E. Snow
Attorney, Agent, or Firm—Kirschstein, Kirschstein, Ottinger & Cobrin

[57] ABSTRACT

A carrier-domain magnetometer (20) incorporating compensation for changes in its domain rotation frequency/magnetic flux density characteristic due to changes in operating conditions, e.g. electric bias and/or ambient temperature conditions, and/or due to ageing, compensation being obtained by providing means (24 to 28) for monitoring the ratio $(F-F_o)/F_o$ where F is the domain rotation frequency when both a magnetic field biassing the magnetometer onto the linear part of its frequency/flux characteristic and a magnetic field to be sensed are applied, and $F_o$ is the domain rotation frequency when the biassing field only is applied.

10 Claims, 5 Drawing Figures

CARRIER-DOMAIN MAGNETOMETERS WITH COMPENSATION RESPONSIVE TO VARIATIONS IN OPERATING CONDITIONS

This invention relates to carrier-domain magnetometers, by which is meant magnetometers of the kind comprising a semiconductor device incorporating a p-n-p-n structure of circular geometry, means for electrically biassing said structure so that the effective current flow in the structure will occur in a limited region, termed a carrier domain, which subtends only a small angle at the central axis of said structure, and means for deriving from the device a signal which will have different magnitudes for different angular positions of the carrier domain with respect to the central axis. The principles of operation of such magnetometers, and details of one type of semiconductor device suitable for use therein, are described in two articles appearing at pages 608-611 of Volume 12 of "Electronics Letters"; further details of these matters are given in a paper appearing at pages 176-184 of Volume 2 of "Solid-state and Electron Devices". Another type of semiconductor device suitable for use in carrier-domain magnetometers is disclosed in British Pat. No. 2,004,117.

If the p-n-p-n structure of a carrier-domain magnetometer is subjected to a sufficiently strong magnetic field directed substantially parallel to its central axis, the carrier domain will rotate continuously around the central axis at a rate dependent on the flux density parallel to that axis; this will give rise to a cyclic variation in the signal derived from the semiconductor device, the frequency of which gives a measure of flux density. Ideally rotation of the carrier domain would occur for any value of the flux density, but in practice it is found that there is a threshold value (dependent on the precise electrical bias conditions) below which rotation does not occur, because inescapable inhomogeneities in the device structure tend to cause the carrier domain to stick at a particular angular position. For flux densities considerably above the threshold, the domain rotation frequency is substantially directly proportional to flux density; thus, as illustrated in FIG. 3 of the second of the articles referred to above and in FIG. 10 of the paper referred to above, the frequency/flux density characteristic of a carrier-domain magnetometer has a substantially linear part for high values of flux density, below which the domain rotation frequency decreases non-linearly with decreasing flux density to reach zero at the threshold value of flux density.

It is possible to use a carrier-domain magnetometer for the measurement of magnetic fields, either steady or alternating, whose magnitudes are below the threshold value. One possible arrangement in this case is to apply a constant biassing field having a flux density above the threshold value, and to sense the change in the domain rotation frequency resulting from the superimposition of the field to be measured on the biassing field. The present invention is concerned specifically with such an arrangement.

A problem that occurs in the operation of a carrier-domain magnetometer is that of sensitivity of the frequency/flux density characteristic to variations in the operating conditions (temperature and electrical bias conditions) of the semiconductor device. In respect of temperature variations, for example, it is found that in general with increasing temperature the threshold value of flux density increases, and the slope of the linear part of the characteristic decreases; in particular the slope may be reduced by about 30% for a 25° C. increase in temperature. Thus if accurate measurements of flux density are to be made with a carrier-domain magnetometer it is necessary either to control closely the temperature and electrical bias conditions of the semiconductor device or to provide some form of compensation in respect of variations in these factors. While sufficiently close control of the bias conditions can normally be achieved by means of conventional stabilisation techniques, a similarly close control of temperature would not be feasible in many applications of the magnetometer, for example those in which the semiconductor device must be exposed to normal ambient conditions.

The present invention is based on the appreciation that, with an arrangement using a biassing field as referred to above, it is possible to incorporate in the magnetometer a simple but very effective form of compensation in respect of variations in the operating conditions of the semiconductor device. The system involved in the invention has the further advantage that it will avoid the need to take account, in the calibration of the instrument, of the differences in characteristics that normally occur between different semiconductor devices of the same type and any changes that may occur in the characteristics of an individual device as a result of ageing processes.

According to the invention a carrier-domain magnetometer is provided with magnetic biassing means for subjecting the p-n-p-n structure of the magnetometer to a substantially constant magnetic field directed substantially parallel to the central axis of said structure and having a magnitude such that over a range of operating conditions of the semiconductor device the magnetometer will be biassed for operation on the linear part of its frequency/flux density characteristic, and means for monitoring the value of the ratio $(F-F_o)/F_o$ or a function thereof, where F represents the frequency of domain rotation when said structure is subjected to the biassing field together with a magnetic field to be sensed, and $F_o$ represents the frequency of domain rotation when said structure is subjected to the biassing field in the absence of a field to be sensed.

It will be appreciated that within the relevant range of operating conditions of the semiconductor device $F_o=KB_o$, where K represents the slope of the linear part of the frequency/flux density characteristic (expressed in appropriate units) and $B_o$ represents the flux density of the biassing field parallel to the central axis of the p-n-p-n structure; likewise $F=K(B_o+B)$, where B represents the flux density of the field to be sensed parallel to said axis (taken in the same sense as for the biassing field). Thus over the relevant range the ratio $F-F_o)/F_o$ is equal to $B/B_o$ regardless of the value K. The calibration of the instrument in terms of B is therefore substantially independent of the temperature, electrical bias conditions and specific characteristics of the semiconductor device, provided that $B_o$ does not vary significantly with temperature; that condition can readily be met, for example by arranging for the biassing field to be generated by a permanent magnet constructed of material having a small temperature coefficient of magnetisation. This effect would of course not be obtained with an instrument in which the quantity $(F-F_o)$ is monitored directly, because of the dependence of K on the operating conditions and characteristics of the semiconductor device. The ratio $(F-F_o)/F_o$ may readily be determined by techniques involving the conversion of the frequencies F and $F_o$ either into analogue signals or into digital form.

Two embodiments of the invention, in the form of instruments for measuring alternating magnetic fields, will now be described by way of example with reference to the accompanying drawings, in which.

Figures 1, 2:
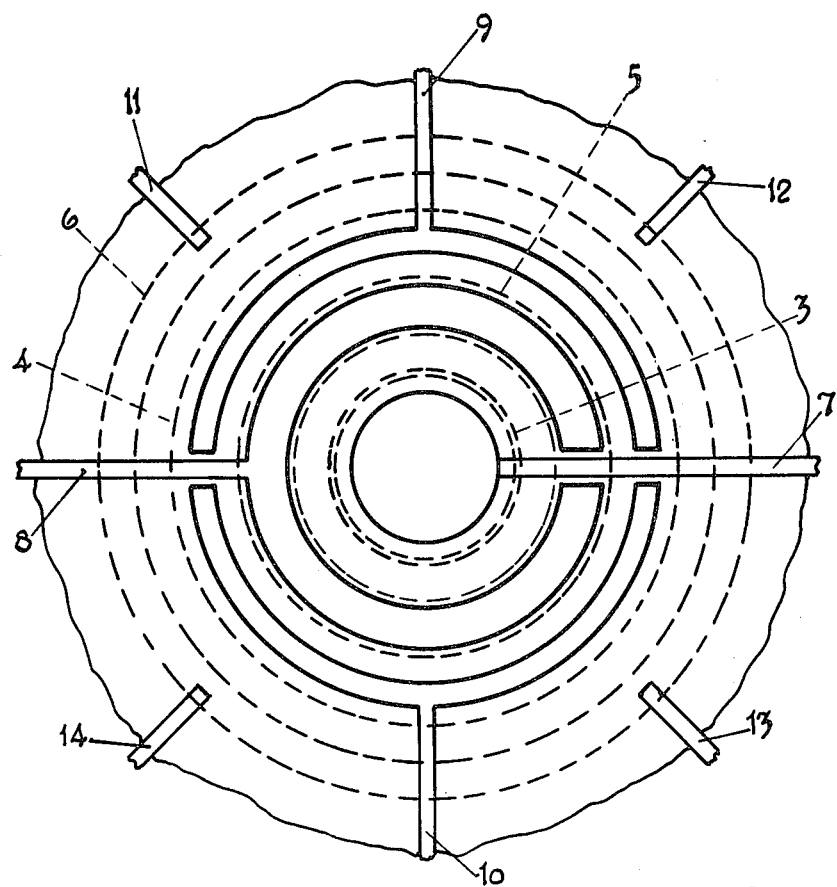
FIG. 1 is a sectional view of part of a semiconductor body incorporated in a device utilised in the instruments.
FIG. 2 is a plan view of part of the device.

The instrument to be described utilises a semiconductor device of the type which is the subject of British Pat. No. 2,004,117, the device being illustrated in FIGS. 1 and 2. Referring to FIG. 1, the device incorporates a semiconductor body in the form of a silicon chip having parallel planar main faces, only one of which (referenced 1) is shown in the drawing. The basic material 2 of the chip is n-type, of resistivity about two ohm-cm, and in the completed device this material serves to form the collector region of an n-p-n transistor structure and the base region of a p-n-p transistor structure. Various other regions 3, 4, 5 and 6 are formed in the chip by diffusion of appropriate impurities through the face 1, the regions 3 and 4 being p-type and the regions 5 and 6 being n-type of low resistivity; the region 3 is of substantially cylindrical form, while the regions 4, 5 and 6 are of annular forms coaxial with the region 3. In the completed device the regions 3 and 5 respectively serve as the emitter regions of the p-n-p and n-p-n transistor structures, the region 4 serves to form the collector region of the p-n-p structure and the base region of the n-p-n structure, and the region 6 serves to provide a low resistance non-rectifying contact to the region 2. Suitably the region 3 may have a diameter of about 120 microns, the radial gap between the regions 3 and 4 may have a width of about two microns, the overall radial width of the region 4 may be about 110 microns, the region 5 may have an inner diameter of about 170 microns and a radial width of about 40 microns, and the region 6 may have an internal diameter of about 400 microns and a radial width of about 30 microns. In FIG. 1, the depths of the regions 3, 4, 5 and 6 are greatly exaggerated compared with their lateral dimensions; they may suitably have values of about three microns for the regions 3 and 4 and two microns for the regions 5 and 6.

The diffusion processes for forming the regions 3, 4, 5 and 6 are carried out in two stages, the first using boron to form the region 3 and an annular p-type region corresponding in volume to the final regions 4 and 5 (suitably with a final sheet resistance of about 100 ohms per square) and the second using phosphorus to form the regions 5 and 6 (suitably with a final sheet resistance of about five ohms per square) and leave the remainder of the annular p-type region constituting the final region 4. In each state the lateral extent of the diffusion is controlled in conventional manner by effecting the diffusion through apertures formed in an oxide layer (not shown) on the face 1, the oxide layer being reformed after each stage.

Referring now to FIG. 2, the device also includes an electrode system in the form of a series of metallic conductors 7 to 14, which are formed by deposition on the chip after completion of the diffusion processes. The conductors 7 to 14 are deposited partly directly on the face 1, through suitable apertures formed in the oxide layer, and partly on the surface of this layer, the arrangement being such that each conductor is in direct contact with one, and only one, of the regions 3, 4, 5 and 6, the positions of which are indicated by the broken lines in FIG. 2. Thus the conductor 7 is in contact with the region 3 over a central circular area, the conductor 8 is in contact with the region 5 over an area which is nearly a complete annulus but has a gap to accommodate the conductor 7, the conductors 9 and 10 are in contact with the region 4 over diametrically opposed areas, disposed outwardly of the region 5, which between them form nearly a complete annulus but leave gaps to accommodate the conductors 7 and 8, while the conductors 11 to 14 are in contact with the region 6 over small areas respectively disposed at angular intervals of 90° around the region 6. The conductors 7 to 14 extend outwardly to conventional bonding pads (not shown) by means of which external connections can readily be made to the device.

It will be appreciated that the device illustrated in FIGS. 1 and 2 includes a p-n-p-n structure of circular geometry constituted by the regions 3, 2, 4 and 5. In operation this structure is electrically biassed so as to form a carrier domain in it; this involves the application of a reverse bias voltage to the p-n junction between the regions 2 and 4 (which serves as the collector-base junction for both transistor structures), and the feeding of currents to the regions 3 and 5 in such senses as to cause holes to be injected from the region 3 into the region 2 and electrons to be injected from the region 5 into the region 4. Where the structural parameters of the device have values as indicated above, the reverse bias voltage for the collector-base junction may suitably have a value of about three or four volts, and the currents fed to the regions 3 and 5 may suitably have values in the respective ranges 5–10 and 10–15 mA. By virtue of the regenerative coupling between the two transistor structures, the actual minority carrier injection is concentrated in a domain of limited angular extent, which will be caused to rotate around the central axis of the structure if the device is subjected to a sufficiently strong magnetic field directed substantially parallel to this axis. The rotation of the carrier domain will give rise to cyclic variations in the individual currents flowing through the conductors 9 to 14, so that the rotation can be sensed by deriving an output signal from one of these conductors, this signal being in the form of a train of current pulses whose recurrence frequency is equal to the domain rotation frequency.

Figure 3:
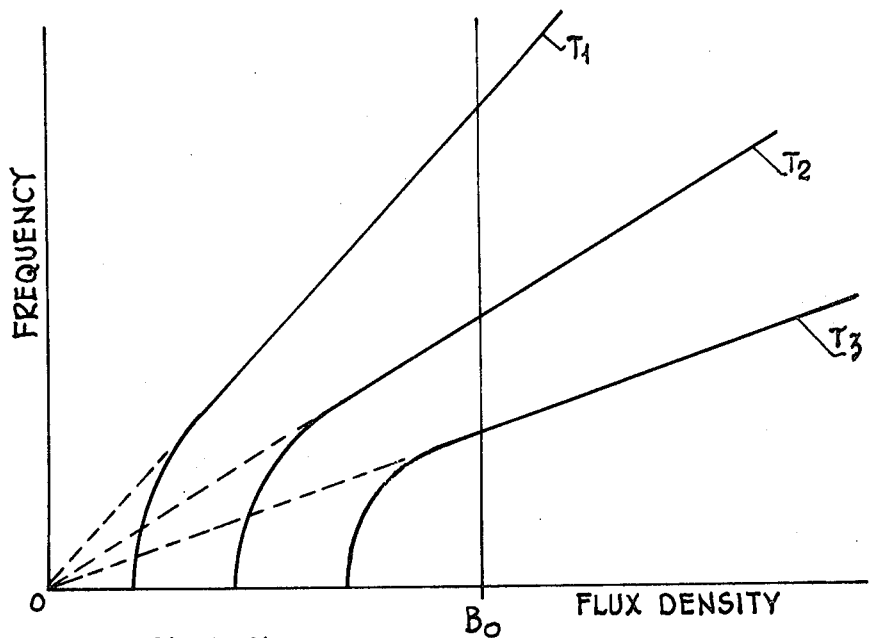
FIG. 3 is an explanatory diagram.

The effects of temperature on the operation of a device as described above are illustrated in FIG. 3, in which domain rotation frequency is plotted against flux density parallel to the central axis of the p-n-p-n structure, the three curves shown corresponding to different temperatures $T_1$, $T_2$ and $T_3$; it is of course assumed that the electrical bias conditions of the device remain constant throughout. It will be noted that the linear part of each curve will pass through the origin of co-ordinates if extrapolated downwards. A set of curves of similar appearance is obtained if any one of the three electrical bias conditions (collector-base voltage and two emitter currents) is varied, and the other two bias conditions together with the temperature are held constant. It will normally be appropriate, however, for the bias voltage and currents to be provided by means of stabilised power supplies, in which case the effects of temperature will be the most significant in respect of variations in the frequency/flux density characteristic.

Figure 4:
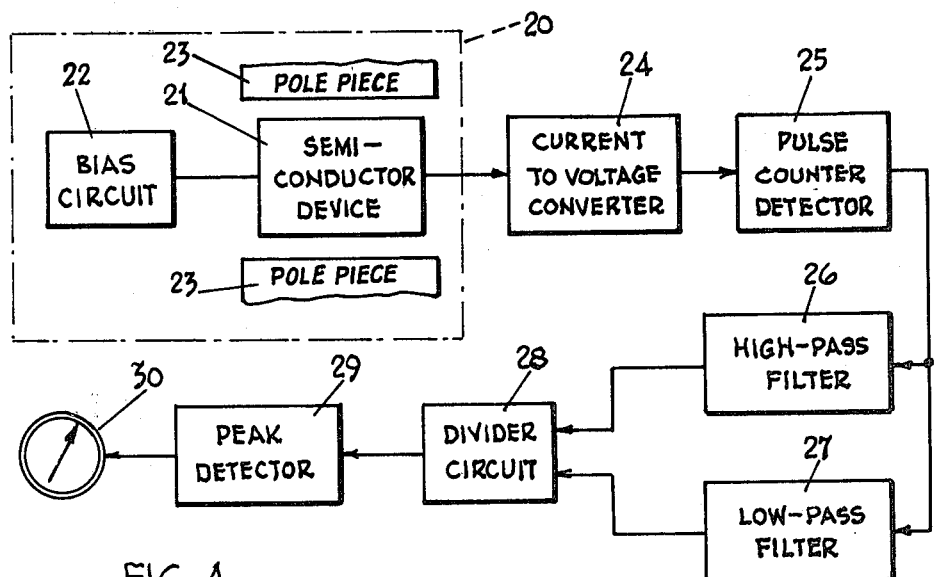
FIG. 4 is a schematic diagram of the first instrument.

Referring now to FIG. 4, the instrument illustrated therein comprises a basic carrier-domain magnetometer indicated by the general reference 20, which incorporates the semiconductor device 21 as described above, a circuit 22 for supplying the appropriate bias voltage and currents to the device 21, and a magnet having pole-pieces 23 between which the device 21 is located with the central axis of the p-n-p-n structure aligned with the field generated by the magnet. In use, the p-n-p-n structure of the device 21 is also subjected to the alternating magnetic field to be measured, with the central axis as nearly aligned as possible with this field; in many applications the field to be measured will be one generated by the flow of alternating current through an appropriate conductor (not shown), for example a coil surrounding the device 21 or a metallic deposit formed on the silicon chip itself. The magnet may be a permanent magnet or an electromagnet energised by a constant current source, and is chosen so that, taking account of the range of flux densities which it is desired to measure, the desired operating range of temperatures, and possible variations in the bias voltage and currents from their nominal values, the total flux density at the device 21 will always correspond to a point on the linear part of the frequency/flux density characteristic of the magnetometer 20. This of course requires the flux density $B_o$ of the biassing field generated by the magnet to exceed (for all possible combinations of the operating conditions of the device 21) the flux density corresponding to the lower end of the linear part of the characteristic, by an amount at least equal to the peak value of flux density for the strongest alternating field which it is desired to measure; this peak value might for example be about 0.01 tesla in a typical application. The necessary arrangement is exemplified by the vertical line in FIG. 3, which indicates a suitable choice of $B_o$ on the assumptions that the electrical bias conditions do not vary significantly and that $T_3$ is that temperature in the desired operating range for which the threshold value of flux density is highest. Where the structural parameters and electrical bias conditions of the device 21 have values as indicated above, the required value of $B_o$ would typically be about 0.5 tesla where it is desired to operate at temperatures up to 100° C. Under these conditions, for sinusoidally alternating fields the domain rotation frequency F will always be given by the expression $K(B_o + A \sin \omega t)$ where A is the peak value of peak density for the field to be measured, $\omega$ is the angular frequency of that field, and K has a value dependent on the operating temperature and the electrical bias conditions.

The output signal derived from the device 21 is fed to a current-to-voltage converter 24, the output of which is applied to a pulse counter detector 25 comprising a monostable circuit which is triggered by the pulses from the converter 24 and which is followed by a low-pass filter, the period of the monostable circuit being chosen so that its reciprocal is greater than the highest value of F which may occur in operation of the magnetometer 20 and the cut-off frequency of the filter exceeding the frequency of the alternating magnetic field and being below the lowest value of F which may occur in operation. The output signal produced by the detector 25 is proportional to the recurrence frequency of the pulse train derived from the device 21, and thus comprises a unidirectional component proportional to $B_o$, and hence $F_o$, and an alternating component proportional to $A \sin \omega t$, and hence $(F-F_o)$, the ratio of these two components is of course independent of the value of K. The two components are separated by means of a high-pass filter 26 which rejects the unidirectional component and a low-pass filter 27 which rejects the alternating component, the outputs of the filters 26 and 27 being respectively applied to the inputs of a divider circuit 28, whose output is proportional to $A \sin \omega t / B_o$, and hence $(F-F_o)/F_o$. If it is desired to determine the peak value A, this output is fed to a peak detector 29 to obtain a signal proportional to $A/B_o$, which is utilised to energise an indicator 30.

It is of course assumed that the variations in the operating conditions of the device 21 for which compensation is required are slow compared with the operation of the signal-processing circuits in the instrument described above.

It is pointed out that while in the particular embodiment described by way of example the ratio $(F-F_o)/F_o$ is monitored directly, in other embodiments a function of this ratio may be monitored. For example in other embodiments in the invention the ratio of signals respectively representative of F and $F_o$ may be monitored, this clearly giving an equivalent result since $F/F_o = ((F-F_o)/F_o) + 1$.

Figure 5:
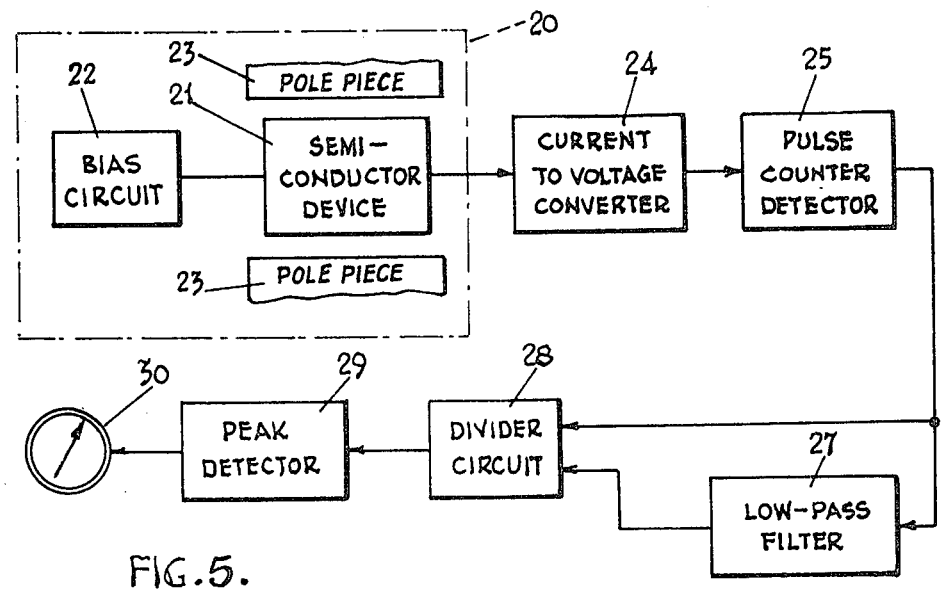
FIG. 5 is a schematic diagram of the second instrument.

Referring now to FIG. 5, the instrument illustrated is identical to that of the first embodiment as depicted in FIG. 4, with the high-pass filter 26 omitted. The inputs to the divider circuit 28 are a signal from the pulse counter detector 25 proportional to F and a unidirectional signal from the low-pass filter 27 proportional to $F_o$, the output of the divider circuit being $F/F_o$.

It will be appreciated that in an arrangement in accordance with the invention the relation between the magnitudes of the magnetic field to be sensed and the biassing field must be such that the p-n-p-n structure operates on a linear part of its characteristic. However, it is pointed out that this does not mean that the field to be sensed must be weak compared with the biassing field unless the field to be sensed opposes the biassing field. Thus, in use of the apparatus to measure the value of an alternating current the current is suitably rectified before being passed through a coil to produce a magnetic field which adds to the biassing field applied to the p-n-p-n structure.

We claim:

1. A carrier-domain magnetometer provided with magnetic biassing means for subjecting the p-n-p-n structure of the magnetometer to a substantially constant magnetic field directed substantially parallel to the central axis of said structure and having a magnitude such that over a range of operating conditions of the semiconductor device the magnetometer will be biassed for operation on the linear part of its frequency/flux density characteristic, and means for monitoring the value of the ratio $(F-F_o)/F_o$ or a function thereof, where F represents the frequency of domain rotation when said structure is subjected to the biassing field together with a magnetic field to be sensed, and $F_o$ represents the frequency of domain rotation when said structure is subjected to the biassing field in the absence of a field to be sensed.

2. A magnetometer according to claim 1 wherein said magnetic biassing means comprises a permanent magnet.

3. A magnetometer according to claim 1 wherein said magnetic biassing means comprises an electromagnet energised from a substantially constant current source.

4. A magnetometer according to claim 1 wherein said monitoring means comprises first means for producing a signal representative of F; second means for deriving from the output of said first means a signal representative of $F-F_o$; third means for deriving from the output of said first means a signal representative of $F_o$; and divider means responsive to the outputs of said second and third means for producing a signal representative of the ratio $(F-F_o)/F_o$.

5. A magnetometer according to claim 4 for use where said magnetic field to be sensed is an alternating magnetic field wherein said first means produces an output signal having a unidirectional component representative of $F_o$ and an alternating component representative of $F-F_o$; said second means comprises a high pass filter arranged to reject said unidirectional component and said third means comprises a low-pass filter arranged to reject said alternating component.

6. A magnetometer according to claim 5 wherein said first means comprises a pulse counter detector.

7. A magnetometer according to claim 6 wherein said pulse counter detector comprises: a monostable circuit having a period whose reciprocal is greater than the highest value of F which may occur in operation and which is triggered at the frequency F; and a low-pass filter responsive to the output of the monostable circuit and having a cut-off frequency higher than the frequency of the magnetic field to be sensed and below the lowest value of F which may occur in operation.

8. A magnetometer according to claim 7 wherein the output of said p-n-p-n structure is applied to the monostable circuit via a current to voltage converter.

9. A magnetometer according to claim 5 including peak detector means responsive to the output of the divider means to produce an output signal representative of the peak value of the magnetic field to be sensed.

10. A magnetometer according to claim 1 wherein said monitoring means comprises first means for producing a signal representative of F; second means for deriving from the output of the said first means a signal representative of $F_o$; and divider means responsive to the outputs of said first and second means for producing a signal representative of the ratio $F/F_o$.

* * * * *